United States Patent [19]

Itoh

[11] Patent Number: 5,313,107
[45] Date of Patent: May 17, 1994

[54] BOOSTER DEVICE

[75] Inventor: Nobuhiko Itoh, Tenri, Japan

[73] Assignee: Sharp Kabushiki Kaisha, Osaka, Japan

[21] Appl. No.: 994,824

[22] Filed: Dec. 22, 1992

[30] Foreign Application Priority Data

Dec. 25, 1991 [JP] Japan ................................ 3-343474

[51] Int. Cl.⁵ ............................................ H03K 17/12
[52] U.S. Cl. .................... 307/246; 307/482; 307/578
[58] Field of Search ............... 307/246, 264, 572, 578, 307/482

[56] References Cited

U.S. PATENT DOCUMENTS

| | | | |
|---|---|---|---|
| 4,176,289 | 11/1979 | Leach et al. | 307/246 |
| 4,503,550 | 3/1985 | Sauer | 307/246 |
| 4,680,488 | 7/1987 | Okumura et al. | 307/578 |
| 4,731,552 | 3/1988 | Miyamoto | 307/578 |
| 5,175,448 | 12/1992 | Fujii | 307/482 |

FOREIGN PATENT DOCUMENTS 61-82529 4/1986 Japan .

*Primary Examiner*—Timothy P. Callahan
*Assistant Examiner*—Shawn Riley
*Attorney, Agent, or Firm*—Morrison & Foerster

[57] ABSTRACT

A booster device of the present invention which boosts a voltage applied to a semiconductor memory device, includes: a first capacitor for supplying a voltage to the semiconductor memory device; a switching transistor for providing a charging current to the first capacitor; a first control transistor for switching a state of the switching transistor between a conducting state and a non-conducting state; a second capacitor for supplying a charge to the switching transistor, whereby the switching transistor uses the charge to perform the switching; and a second control transistor for controlling the first control transistor and for supplying a charge to the second capacitor.

7 Claims, 2 Drawing Sheets

BOOSTER DEVICE

BACKGROUND OF THE INVENTION

1. Field of the Invention

The present invention relates to a booster device for boosting an internal potential (e.g., $V_{pp}$ level) in a semiconductor memory device.

2. Description of the Related Art

FIG. 2 shows a conventional example of a booster device for boosting a $V_{pp}$ level. The structure and operation of the booster device can be described as follows.

A conventional booster device includes an inverter I16, transistors Q13 and Q14, and a capacitor C15. A terminal 12 is connected to an input of the inverter I16. An output of the inverter I16 is connected to gates of the transistors Q13 and Q14. The output of the inverter I16 and the gates of the transistors Q13 and Q14 are connected together at a node 17. A power source level $V_{pp}$ is supplied to the inverter I16. A power source level $V_{cc}$ is supplied to a drain of the transistor Q13. A source of the transistor Q13 is connected to a drain of the transistor Q14 and one of electrodes of the capacitor C15. The source of the transistor Q13 the drain of the transistor Q14 and the one of the electrodes of the capacitor C15 are connected at a node 18. Another electrode of the capacitor C15 is connected to a terminal 11. A power source level $V'_{pp}$ to a semiconductor memory device 17' is provided at a source of the transistor Q14.

In the conventional booster device of FIG. 2, when the terminals 11 and 12 are grounded, for example, by being connected to $V_{GND}$ via an external circuit including switches SW1 and SW2, a level of an input signal to the inverter I16 is a logic LOW. When the level of the input signal to the inverter I16 is LOW, the level of an output signal from the inverter I16 is HIGH. When the level of the output signal from the inverter I16 is HIGH, the transistor Q13 is ON and the transistor Q14 is OFF. When the transistor Q13 is ON, the voltage across the capacitor C15 is increased to the level of $V_{cc}$. The power source level $V_{pp}$, serving as the supply voltage to the inverter I16, is supplied as the logic HIGH level to the gates of the transistors Q13 and Q14 via the inverter I16 output and the node 17.

Then, the terminals 11 and 12 are connected to a logic HIGH level via a power supply PS and switches SW1, SW2, for example, whereby the level of the output signal from the inverter I16 becomes a logic LOW level. When the level of the output signal from the inverter I16 is LOW, the transistor Q13 is OFF and the transistor Q14 is ON. When the transistor Q14 is ON, a charge of the capacitor C15 is discharged as the power source level $V'_{pp}$ to the semiconductor memory device via the transistor Q14.

In the above-described conventional booster device, the electrical potential at the node 17 is decreased in the event that the $V_{pp}$ level at the time when power to the booster device is turned on does not reach a sufficiently high level. Thus, there is a problem that the transistor Q13 will not be turned on completely. Since the transistor Q13 is not turned on completely, the capacitor C15 is not charged completely, and in particular, the $V'_{pp}$ level is resultantly a lower power source voltage.

In view of the aforementioned shortcoming associated with a conventional booster device, there exists a strong need in the art for a booster circuit which ensures that a transistor for charging a capacitor is turned on fully, irrespective of the $V_{pp}$ level.

SUMMARY OF THE INVENTION

According to one aspect of the present invention, a booster device of the present invention which boosts a voltage applied to a semiconductor memory device, includes: a first capacitor for supplying a voltage to the semiconductor memory device; a switching transistor for providing a charging current to the first capacitor; a first control transistor for switching a state of the switching transistor between a conducting state and a non-conducting state; a second capacitor for supplying a charge to the switching transistor, whereby the switching transistor uses the charge to perform the switching; and a second control transistor for controlling the first control means and for supplying a charge to the second capacitor.

Thus, the invention described herein makes possible the advantage of providing a booster device in which a transistor for charging is forced to be turned on, irrespective of the $V_{pp}$ level, whereby a sufficiently high $V'_{pp}$ level is supplied to the $V_{pp}$ terminal of the semiconductor memory device.

This and other advantages of the present invention will become apparent to those skilled in the art upon reading and understanding the following detailed description with reference to the accompanying figures.

DESCRIPTION OF THE PREFERRED EMBODIMENT

Hereinafter, the present invention will be described by way of an example.

EXAMPLE

Figure 1:
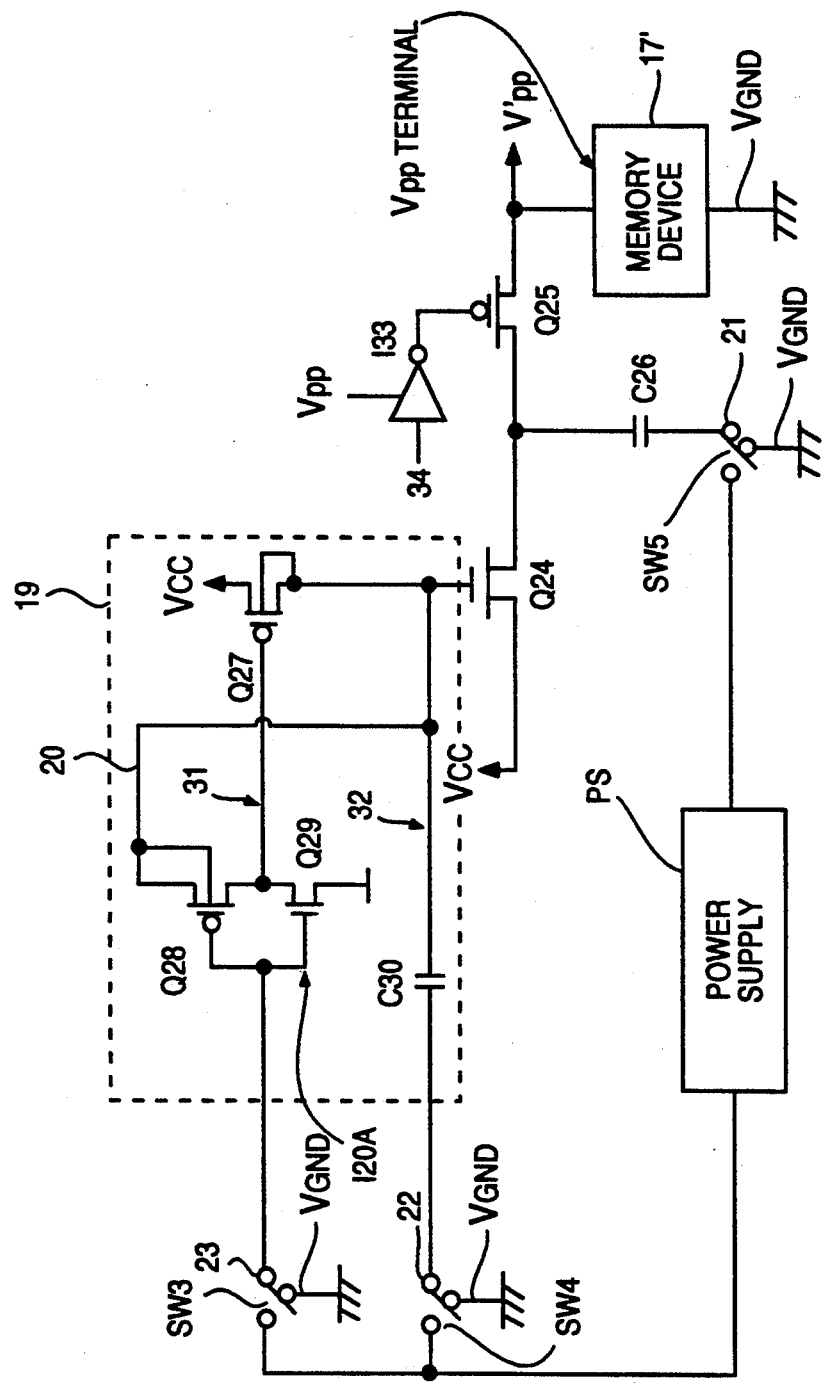
FIG. 1 is a circuit diagram of a booster device for a semiconductor memory device according to the present invention.
Figure 2:
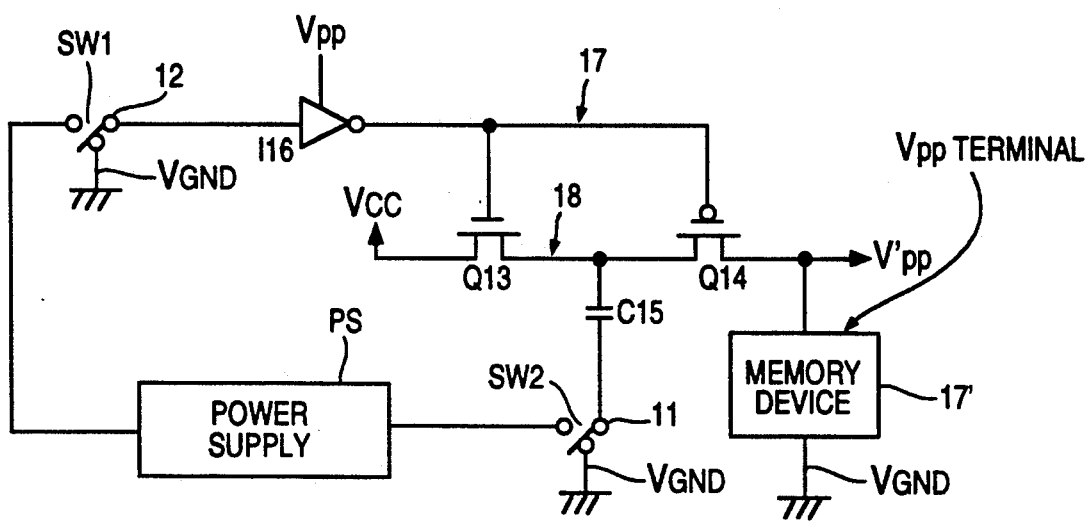
FIG. 2 is a circuit diagram of a conventional booster device.

FIG. 1 is a circuit diagram of a booster device 19 according to the present invention. The booster device 19 includes transistors Q24 and Q25, an inverter I33, a capacitor C26 and a driving circuit 20. The driving circuit includes transistors Q27, Q28 and Q29, and a capacitor C30. The driving circuit 20 forcibly turns on the transistor Q24 for charging the capacitor C26 irrespective of the $V_{pp}$ level.

A terminal 23 is connected to gates of the transistors Q28 and Q29. A source of the transistor Q28 and a drain of the transistor Q29 are connected to a gate of the transistor Q27. The source of the transistor Q28, the drain of the transistor Q29 and the gate of the transistor Q27 are connected at a node 31 as is shown. A drain of the transistor Q28 is connected to a source of the transistor Q27, a gate of the transistor Q24 and one of electrodes of the capacitor C30. The drain of the transistor Q28, the source of the transistor Q27 and one of the electrodes of the capacitor C30 are connected at a node 32. The other electrode of the capacitor C30 is connected to a terminal 22. A source of the transistor Q29 is grounded. A power source level $V_{cc}$ is supplied to a drain of the transistor Q24 and a drain of the transistor Q27. A source of the transistor Q24 is connected to a drain of the transistor Q25 and one of electrodes of the capacitor C26. The other electrode of the capacitor C26 is connected to a terminal 21.

A source of the transistor Q25 is connected to a $V_{pp}$ terminal (designated $V'_{pp}$ for sake of clarity) of the semiconductor memory device. A terminal 34 is connected to an input of the inverter I33. An output of the inverter I33 is connected to a gate of the transistor Q25. A power source level $V_{pp}$ is supplied to the inverter I33.

The transistors Q24 and Q29 are n-MOS transistors, and the transistors Q25, Q27, and Q28 are p-MOS transistors.

Operation of the booster device 19 is conducted as follows.

First, a level of an input signal to the terminals 21 and 22 are set at a logic LOW level, and a level of an input signal to the terminal 23 is set at a HIGH level. Again, this is shown by way of a series of switches SW3–SW5 and a logic level HIGH power supply PS. However, it will be appreciated that such logic level input signals can be provided by any number of different devices and/or input circuits. The scope of the present invention is intended to encompass all such devices.

When the level of the input signal to the terminal 23 is HIGH, the transistor Q28 is OFF and the transistor Q29 is ON. When the transistor Q29 is ON, the level of a signal at the node 31 reaches the LOW level (e.g., ground) and the transistor Q27 is turned on. When the transistor Q27 is ON, the level of a signal at the node 32 reaches the HIGH level, and the capacitor C30 is charged via the power source $V_{cc}$. When the level of the signal at the node 32 is HIGH, the gate of the transistor Q24 is HIGH. When the gate of the transistor Q24 is HIGH, the transistor Q24 is turned on and the capacitor C26 is also charged with a current from the power source $V_{cc}$.

Then, when the level of the input signal to the terminal 23 is switched to the LOW level, e.g., via the switch SW3, the transistor Q28 is turned on and the transistor Q29 is turned off. Since the transistor Q28 is ON, the nodes 31 and 32 are short-circuited. After the transistor Q28 is turned on, the level of the input signal to the terminal 22 is switched to the HIGH level, e.g., via the switch SW4, thereby boosting the node 32, i.e., the charge applied to the capacitor C30 is applied to the node 32. Due to the voltage boosted by the capacitor C30, the transistor Q24 is turned on completely to sufficiently charge the capacitor C26. When the transistor Q24 is completely turned on, the nodes 31 and 32 are still short-circuited, so that the transistor Q27 remains in an OFF state.

When the charging of the capacitor C26 is completed, the level of the input signal at the terminal 22 is switched to the LOW level and the level of the input signal at the terminal 23 is switched to the HIGH level, whereby the level of the signal at the node 31 is set at the LOW level and the level of the signal at the node 32 is set at the HIGH level. When the level of the signal at the node 32 is HIGH, the transistor Q24 is turned on.

After that, the levels of the input signals at the terminals 21 and 34 are set at the HIGH level via the switch SW5 and the like, for example: since the level of an output signal from the inverter I33 will be LOW, the transistor Q25 is turned on to supply the $V'_{pp}$ level generated by the capacitor C26 in the booster device to the $V_{pp}$ terminal of the semiconductor memory device.

According to the booster device, since the driving circuit 20 is provided, the transistor Q24 is forcibly turned on due to the voltage of the capacitor C30 which is charged by the transistor Q27. The transistor Q27 is controlled by the transistors Q28 and Q29 which form an inverter I20A as will be appreciated. Thus, the transistor Q24 can be turned on without fail, and the capacitor C26 can sufficiently be charged.

In another embodiment, the transistors Q24, Q25, Q27, Q28 and Q29 may be bipolar transistors as will also be appreciated.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A booster device for boosting a voltage applied to a semiconductor memory device, comprising:
   a first capacitor for supplying a voltage to the semiconductor memory device;
   a switching means for providing a charging current to the first capacitor;
   a second capacitor for supplying a charge to the switching means, whereby the switching means uses the charge to perform the switching;
   a first control means for switching a state of the switching means between a conducting state and a non-conducting state and for supplying a charge to the second capacitor; and
   a second control means for controlling the first control means, the second control means being connected to the first control, the second capacitor and the switching means via a node, a potential at the node being applied to the second control means.

2. A booster device according to claim 1, wherein the first control means forcibly switches the conducting state of the switching means to the non-conducting state and vice versa.

3. A booster device according to claim 1, wherein the first switching means is a transistor.

4. A booster device according to claim 3, wherein the first control means is connected to a gate of the transistor.

5. A booster device according to claim 3, wherein the second capacitor is connected to a gate of the transistor.

6. A booster device according to claim 1, wherein the second control means is an inverter.

7. A booster device according to claim 1, wherein the first control means is a P-MOS transistor.

* * * * *